United States Patent [19]

Hirata

[11] 4,414,687
[45] Nov. 8, 1983

[54] RADIO RECEIVER
[75] Inventor: Seiichiro Hirata, Nagaokakyo, Japan
[73] Assignee: Mitsubishi Denki Kabushiki Kaisha, Tokyo, Japan
[21] Appl. No.: 288,199
[22] Filed: Jul. 29, 1981
[30] Foreign Application Priority Data Aug. 4, 1980 [JP] Japan .................................. 55-108564
Aug. 4, 1980 [JP] Japan .................................. 55-108565

[51] Int. Cl.³ .............................................. H04B 1/26
[52] U.S. Cl. .................................... 455/165; 455/166; 455/183; 455/194
[58] Field of Search ............... 455/165, 183, 184, 161, 455/166, 76, 77, 194; 331/1 A, 17

[56] References Cited
U.S. PATENT DOCUMENTS

| 3,882,400 | 5/1975 | Hamada | 455/194 |
| 4,142,158 | 2/1979 | Belisomi | 455/183 |
| 4,146,839 | 3/1979 | Troy | 455/165 |
| 4,253,194 | 2/1981 | Van Deursen | 455/161 |

OTHER PUBLICATIONS
Developments in Phase Locked Loop Tuning Systems–Steve Yeung–Feb. 1979–New Electronics (Great Britain), vol. 12, No. 3, pp. 64–68.

Primary Examiner—Marc E. Bookbinder
Attorney, Agent, or Firm—Wenderoth, Lind & Ponack

[57] ABSTRACT

A radio receiver which includes a phase locked loop including a voltage controlled oscillator which is connected to a frequency mixer, a two modulus prescaler having a feedback down counter and to a programmable divider. During the reception of a first broadcasting station, a control unit decreases the time constant of the phase locked loop for an extremely short time and sets frequency division ratios of the down counter and the programmable divider so as to receive a second broadcasting station. The two modulus prescaler frequency divides an output from the voltage controlled oscillator at a frequency division ratio $1/(P+1)$ until the count of the down counter is equal to zero. Then, the prescaler effects a frequency division at a frequency division ratio of $1/P$. The phase locked loop is locked to the second station and its reception level is sensed. When the first station has a stored reception level higher than the now sensed level, the control unit is similarly operated so as to again receive the first station.

3 Claims, 8 Drawing Figures

RADIO RECEIVER

BACKGROUND OF THE INVENTION

This invention relates to radio receiver, and more particularly to a radio receiver such as a car radio for receiving a radio wave from a broadcasting station and sensing a reception status of a radio wave from another broadcasting station during the reception of the first-mentioned radio wave.

Radio receivers of the type referred to equipped, for example, on a motor vehicle can normally receive a radio wave, such as an FM broadcasting wave, from a broadcasting station within a service area thereof but when the radio receivers go out of that service area, they can not well receive the radio wave. At that time, it is required to select a different broadcasting station having a good reception status in place of the broadcasting station received up to that time. Accordingly, each time the reception status becomes poor, the user must perform the operation of selecting a broadcasting station.

Now, in Europe, for example, there are regions each including a plurality of broadcasting stations disposed in scattered relationship therein and transmitting a common broadcast program at different frequencies. In those regions, it has been considered that the user receives a radio wave from a broadcasting station (which is called hereinafter "the present station") while he or she can sense the reception status of radio waves from a plurality of broadcasting stations transmitting the common broadcast program at different frequencies. Then, when the present station's reception status deteriorates he or she switches to that radio wave having a good reception status.

Thus, there have been proposed radio receivers having a pair of tuners disposed thereon, one of which is tuned to the radio wave from the present station and the other of which is tuned to that from a different broadcasting station for the purpose of sensing the reception status of the latter wave. However, those radio receivers have come into question in that they are expensive and large sized and that a single antenna is used with the pair of tuners to selectively receive a pair of radio waves, resulting in a decrease in the sensitivity of the antenna.

In order to solve this question, a method has been considered by which a radio receiver having a single tuner receives a radio wave from the present station and, by suspending the reception of the present station for an extremely short time interval, the receiver senses the reception status of a radio wave from a different broadcasting station within that time interval.

As an example, a radio receiver forming the prior art of the present invention has comprised a usual superhetrodyne receiver unit including a muting circuit, a digital frequency synthesizer in the form of a phase locked loop including a voltage controlled oscillator connected to a frequency mixer included in the superhetrodyne receiver unit and having its output fedback thereto through a prescaler, a programmable divider, a phase detector applied with a reference frequency and a loop filter.

In operation, a control unit applies first a frequency division ratio for the present station to the programmable divider to lock the phase locked loop to the frequency of the present station. At that time, the radio receiver receives a radio wave from the present station by having the voltage controlled oscillator generating a local oscillation frequency required for doing so. Then, the resulting reception level is sensed and stored.

If an attempt is made to sense the reception status of a different broadcasting station during the reception of the present station, then the control unit applies a muting pulse with an extremely short duration to the muting circuit to mute an output therefrom while at the same time the control unit applies a loop band changing pulse to the loop filter to decrease the time constant thereof so as to thereby accelerate the locking of the phase locked loop. Simultaneously, the control unit applies a frequency division ratio for the different broadcasting station to tune the receiver to that station as described above. The resulting reception level is sensed and compared with the stored reception level. When the present station is determined to be higher in reception level than the different station, the control unit applies the frequency division ratio for the present station to the programmable divider to permit the receiver to receive the present station.

The change of the present to the different station and the return of the different to the present station should be accomplished within the extremely short duration of the muting pulse which has been experimentally found to be of 5 milliseconds or less with the satisfactory result. Otherwise, the human auditory feeling is impeded.

In order to decrease the time interval for which the reception of the present station is suspended, it is necessary to decrease the frequency divisor or the reciprocal of frequency division ratio of the prescaler and that of the programmable divider and to increase the reference frequency as a result of a mathematical analysis of the phase locked loop.

The majority of integrated circuit elements employed with conventional phase locked loops for the FM band have the frequency divisor of their prescaler set to be not less than ten (10) and have their reference frequency set to be not higher than 5 kilohertz in view of their manufacturing processes. Therefore, conventional phase locked loops have been disadvantageous in that the response time thereof is increased so as to lengthen the time interval for which the reception of the present station is suspended during the reception thereof.

Also, when the phase locked loop has a high natural angular frequency the pulling-in time thereof is decreased, resulting in an increase in jitter of the voltage controlled oscillator which acts as a local oscillator. Therefore, the receiver has a decreased signal-to-noise ratio.

Accordingly, it is an object of the present invention to provide a new and improved radio receiver including a phase locked loop having an increased response speed and having an extremely fast changeover speed when locked to the frequency of a broadcasting station which is changed from the present station to another station following the suspension of the reception of the present station.

SUMMARY OF THE INVENTION

According to one aspect thereof, the present invention provides a radio receiver for receiving, during the movement thereof, a common broadcast program selectively from at least first and second broadcasting stations disposed in a scattered relationship and transmitting the common broadcast program at different frequencies, which receiver comprises a tuner and a local oscillator circuit therefor, the local oscillator circuit having a phase locked loop including a voltage controlled oscillator, a prescaler constructed to have a frequency division ratio which is changeable from one to another of two values, the prescaler frequency-dividing an oscillator output signal from the voltage controlled oscillator, a first frequency dividing means constructed to have a settable frequency division ratio, the first frequency dividing means frequency-dividing an output signal frequency-divided at the first value of the frequency division ratio from the prescaler at the set frequency division ratio to change the frequency division ratio of the prescaler with a frequency divided output from the same, a second frequency-dividing means constructed to have a settable frequency division ratio, the second frequency dividing means frequency-dividing outputs frequency divided at the first and second value of the frequency division ratio from the prescaler at the set frequency division ratio, a phase detector for receiving a reference signal and an output signal from the second frequency dividing means, and a loop filter for imparting an output signal, as a control voltage, to the voltage controlled oscillator, a first control means for tuning the tuner to the frequency of the second broadcasting station for a relatively short time interval during the tuning of the tuner to the frequency of the first broadcasting station, a level comparison means for comparing a first reception level at which the tuner is tuned to the frequency of the first broadcasting station with a second reception level at which the tuner is tuned to the frequency of the second broadcasting station, and second control means responsive to the second reception level higher than the first reception level as determined by the level comparison means to change the tuning of the tuner to be tuned to the frequency of the second broadcasting station.

Preferably, the loop filter may include loop time constant changing means for decreasing the time constant of said phase locked loop during the relatively short time interval.

Advantageously, the radio receiver may comprise muting means for attenuating a voice output during the relatively short time interval.

According to another aspect thereof, the present invention provides a radio receiver comprising a local oscillator circuit including a digital frequency synthesizer having a phase locked loop, wherein the receiver provided with a command frequency changing means for instructing a change of a received frequency, and a loop time constant changing means which is responsive to the instruction from the command frequency changing means so as to decrease the time constant of the phase locked loop to shorten the time interval within which the phase locked loop is locked to a received frequency to be changed.

Preferably, the loop time constant changing means may include a resistance means disposed in the phase locked loop and an analog switch responsive to the instruction from the command frequency changing means.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
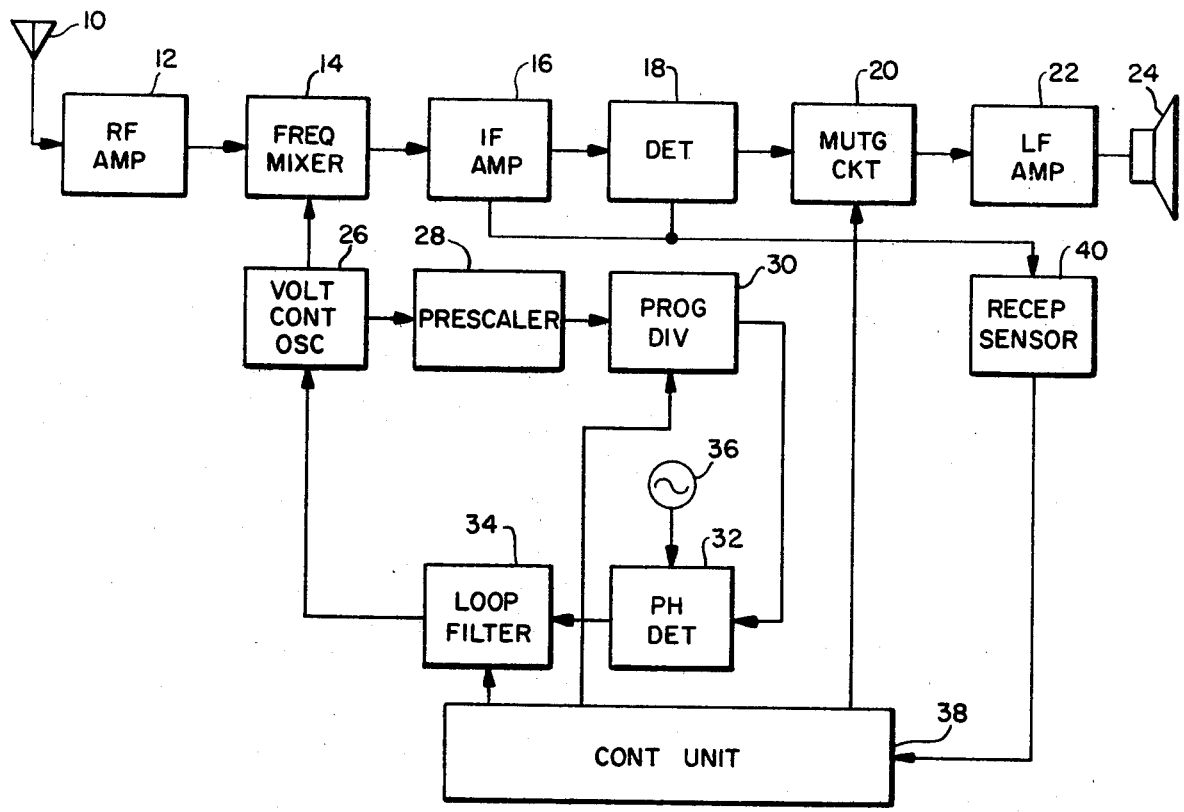
FIG. 1 is a block diagram of a radio receiver forming the prior art of the present invention.

Referring now to FIG. 1 of the drawings, there is illustrated a radio receiver forming the prior art of the present invention. The illustrated arrangement comprises an antenna 10, a high frequency amplifier 12, and a frequency mixer 14 connected in series to form a tuner comprising the amplifier 12 and the mixer 14. The frequency mixer 14 is connected to a series combination of an intermediate frequency amplifier 16, a detector 18, a muting circuit 20, a low frequency amplifier 22 and a loudspeaker 24. Thus, a well-known superheterodyne receiver is formed of the components 12 through 24.

The frequency mixer 14 has one input connected to the high frequency amplifier 12 and another input connected a digital frequency synthesizer formed of a phase locked loop (which is abbreviated hereinafter as a "PLL") including a voltage controlled oscillator 26, a prescaler 28, a programmable devider 30, a phase detector 32 and a loop filter 34 connected in series, and further includes a reference oscillator 36 which is connected to the phase detector 32; the output of the loop filter 34 is connected to the voltage controlled oscillator 26. The voltage controlled oscillator 26 is connected to another input of the frequency mixer 14 to form a local oscillator circuit with the components 28, 30, 32, 34 and 36.

The arrangement further comprises a control unit 38 which is connected to the programmable divider 30 and the loop filter 34 and the muting circuit 20 and still further comprises a reception sensor 40 whose input is connected at the input to both the intermediate frequency amplifier 16 and the detector 18.

The control unit 38 may comprise a microcomputer and is operative to apply data of a frequency division ratio, to the programmable divider 30. The PLL is locked to a frequency as determined by the data of the frequency division ratio. The voltage controlled oscillator 26 generates a local oscillator frequency as determined by the frequency division ratio now applied to the programmable divider 30 and, in this case, the appointed frequency which is alloted to the present broadcasting station. The frequency mixer 14 responds to the local oscillator frequency applied thereto so as to tune the tuner to the frequency of the present station.

Therefore, a radio wave from the present station is received by the arrangement of FIG. 1 and the reception sensor 40 senses the reception level thereof and then stores this level in a memory (not shown).

During the reception of the present station, it may be desired to tune the tuner to a frequency of a different broadcasting station which is identical in its broadcast program to the present station. At that time, the control unit 38 applies a muting pulse with an extremely short duration to the muting circuit 20. This results in the attenuation of an output from the muting circuit 20 and therefore an attenuation in the voice output from the loudspeaker 24.

Figure 2:
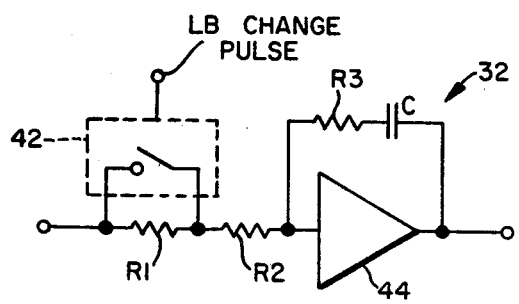
FIG. 2 is a circuit diagram of the loop filter shown in FIG. 1.

At the same time, the control unit 38 applies a loop band changing signal to the loop filter to close an analog switch 42 shown in FIG. 2 wherein the details of the loop filter 34 is illustrated.

As shown in FIG. 2, the loop filter 34 comprises the analog switch 42 which is normally in its open position and is connected across a resistor R1 subsequently connected to an input of an operational amplifier 44 through a resistor R2. The operational amplifier 44 includes a feedback network formed of a resistor R3 and a capacitor C which are serially connected across the input and the output of the amplifier 44.

The closure of the analog switch 42 shortcircuits the resistor R1 to leave the resistor R2 connected to the series combination of the resistor R3 and the capacitor C in the loop filter. This means that the time constant of the loop filter of the PLL decreases and the PPL is accelerated into the locked state.

Also, simultaneously with the application of the muting signal to the muting circuit 20, the control unit 38 applies to the programmable divider 30 data of a frequency division ratio required for the tuner to be tuned to a frequency of a different broadcasting station. The PLL is operated so as to be locked to a frequency of the different station until the voltage controlled oscillator 26 generates a local oscillator frequency as determined by the frequency division ratio. Therefore, the tuner is tuned to the frequency of the different station and the resulting reception level is sensed by the reception sensor 40 and is compared with the reception level from the present station stored in the abovementioned memory (not shown).

If the present station has a higher reception level than the different station as a result of the comparison, then the control unit 38 applies to the programmable divider 30 the data of the frequency division ratio required for the present station to again be received. Thereafter, the PLL is operated in the manner as described above, and the tuner is again tuned to the frequency of the present station.

A series of the operations as described above is required to be performed within a time interval corresponding to the extremely narrow pulse-width or duration of the muting pulse applied to the muting circuit 20 for the following reason. The time interval for which the reception of the present station is suspended must be very short so as to prevent the human auditory feeling from being impeded, i.e. there must be an extremely short time interval between the suspension of the reception of the present station followed by the tuning to a different station so as to determine its reception level and then the return of the tuning from the different station to the present station. The result of various experiments has indicated that the suspending time interval must be substantially within milliseconds to have a satisfactory result.

Assuming now that M designates an integral frequency divisor or the reciprocal of a frequency division ratio by N that by the programmable divider 30, Fs designates a reference frequency from the reference oscillator 36, F designates an oscillator frequency of the voltage controlled oscillator 26 or a local oscillator frequency. F may be expressed by:

$$F = MNFs \qquad (1)$$

From the expression (1) it is seen that, if the frequency divisor N by the programmable divider 30 increases by increments of one (1), then the digital frequency synthesizer has a step frequency expressed by MFs. On the other hand, when the loop filter 34 is formed of a high gain active filter such as that shown in FIG. 2, the digital frequency synthesizer has a natural angular frequency $\omega n$ and a damping constant $\xi$ respectively expressed by:

$$\omega n = \sqrt{\frac{KoKd}{\tau_1 MN}} \qquad (2)$$

and $$\xi = \frac{\tau_2}{2} \sqrt{\frac{KoKd}{\tau_1 MN}} \qquad (3)$$

wherein Ko and Kd respectively designate a gain of the voltage controlled oscillator and a sensitivity of the phase detector, and wherein $\tau_1$ and $\tau_2$ respectively designate $R_2C$ or $(R_1+R_2)C$ and $R_3C$. From the expressions (2) and (3) it is seen that with the damping constant $\xi$ held constant, a pulling-in time may be shortened by increasing the natural angular frequency $\omega n$. This M, N and $\tau$, may be decreased with Ko and Kd remaining unchanged. For a constant local oscillator frequency, a decrease in MN requires an increase in reference frequency Fs.

Assuming that a radio receiver such as shown in FIG. 1 is used with the FM band in Europe, then $$MFs = 50 \text{ kHz} \qquad (4)$$

broadcasting stations have respective frequencies which are varied by increments of 50 kilohertzs. The expression (1) teaches that the reference frequency Fs may increase so as to decrease MN and the expression (4) teaches that, in order to increase the reference frequency Fs, M must decrease.

The greater part of integrated circuit elements employed with conventional PLL's for the FM band have an M of not less than ten (10) and a reference frequency which is not higher than 5 kilohertzs in view of their manufacturing processes. In other words, a reference frequency Fs in excess of 5 kilohertzs could not be used and therefore the natural angular frequency $\omega n$ could not lower and even if $\tau_1$ is decreased, then the pulling-in time could not be shortened. This has resulted in a long response time and has accordingly resulted in the disadvantage that during the reception of the present station, a suspension time interval is lengthened.

The present invention provides a radio receiver comprising a digital frequency synthesizer including a PLL having a shortened response time so as to be locked extremely fast upon changing from one frequency to another of frequency of a plurality of broadcasting stations.

According to one aspect of the present invention, an output from a voltage controlled oscillator disposed in a PLL is applied to a two modulus prescaler capable of changing its frequency division ratio from 1/P to 1/(P+1), where P is an integer. One portion of an output frequency divided by the frequency division ratio 1/(P+1) from that prescaler is further frequency divided at an externally set frequency division ratio of 1/$n_1$ by a down counter. An output from the down counter which is frequency divided $n_1$ times is then applied to the two modulus prescaler so as to change its frequency division ratio to 1/P. On the other hand, the remaining part of the output from the two modulus prescaler is applied to a programmable divider used as a second counter means so as to be frequency divided $N_P$ times. An output which is thus frequency divided from the programmable divider is applied to a phase detector so as to permit a relatively high reference frequency to be applied to the phase detector.

Figure 3:
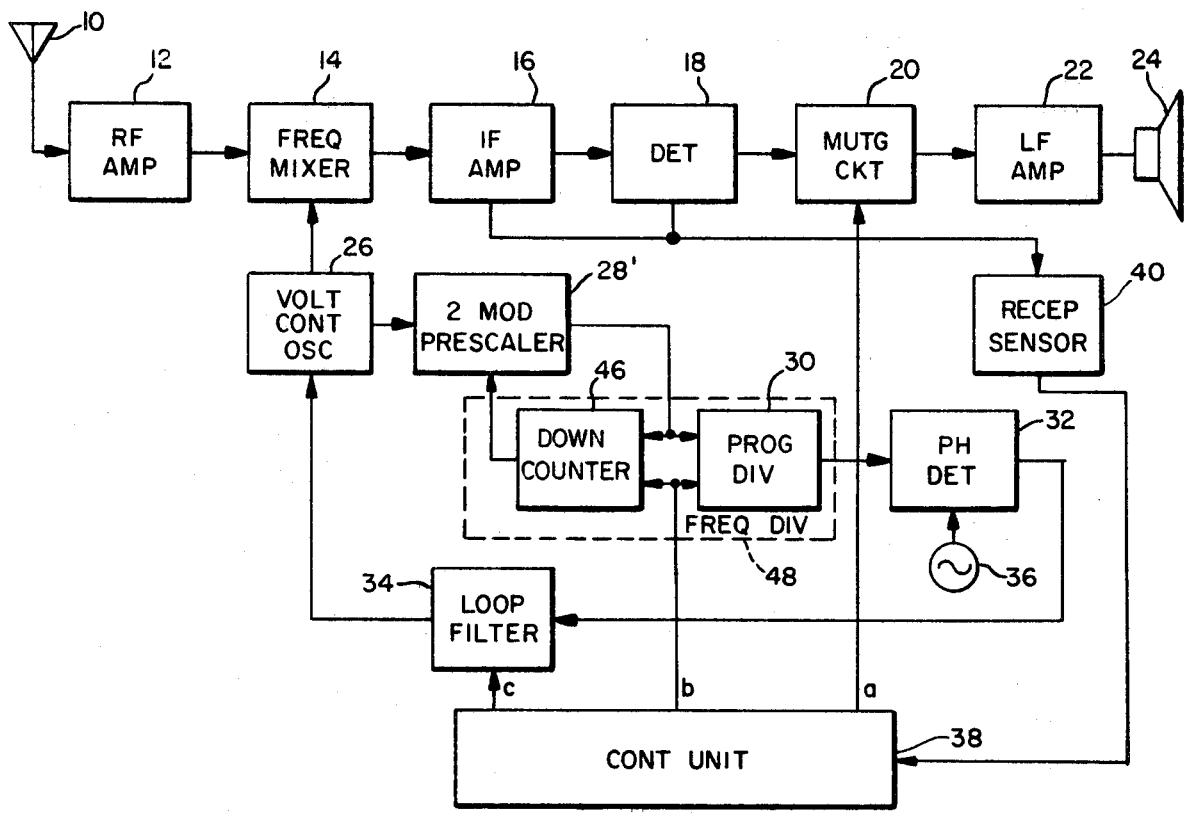
FIG. 3 is a block diagram of one embodiment according to the radio receiver of the present invention.

Referring now to FIG. 3, wherein like reference numerals designate the components identical or corresponding to those shown in FIG. 1, there is illustrated one embodiment according to the radio receiver of the present invention. The illustrated arrangement is different from that shown in FIG. 1 only in that in FIG. 3 a two modulus prescaler 28' is substituted for the prescaler 28 shown in FIG. 1 and forms a loop with a down counter 46. The down counter 46 and the programmable divider 30 form a frequency dividing means 48.

The two modulus counter 28' is designed and constructed so that it can change its frequency division ratio from between two values, namely, between 1/P and 1/(P+1), where P designates an integer with a frequency divided output from the down counter 46. More specifically, the two modulus prescaler 28' is operative to effect the frequency division at the frequency division ratio 1/(P+1) of frequency division 1/(P+1) up until a zero count of the down counter 44 and with the frequency division ratio 1/P upon the down counter 44 reaching a zero count.

Figure 4:
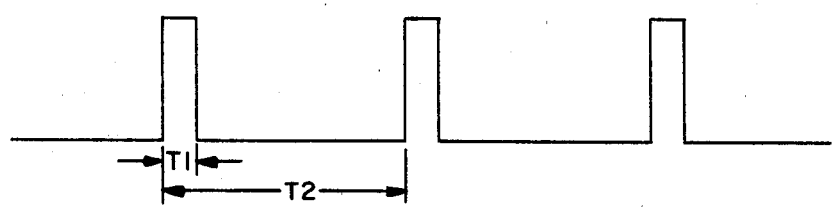
FIG. 4 is a waveform illustrating a train of muting pulses applied to the muting circuit shown in FIG. 1.

The operation of the arrangement shown in FIG. 3 will now be described with reference to FIGS. 4, 5 and 6, wherein there are illustrated waveforms developed at various points in the arrangement. When, during the reception of the present station, an attempt is made to sense the reception level from a different broadcasting station, the control unit 38 applies to the muting circuit 20 a muting pulse of a muting pulse train having an extremely short pulse width or duration T1 and a pulse reception period T2 as shown in FIG. 4. For example, the pulse width T1 is of about 5 milliseconds and the pulse reception period T2 is of about 1 second. The results of various experiments indicate that a duration T1 of not longer than 5 milliseconds and the pulse reception period of not shorter than 0.5 second do not impede the human auditory feeling even during the reception of a radio wave.

Figure 5:
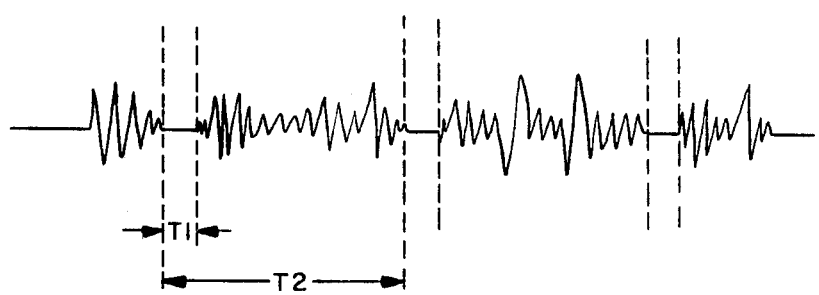
FIG. 5 is a graph which is useful in explaining the operation of the muting circuit shown in FIG. 3.
Figure 6:
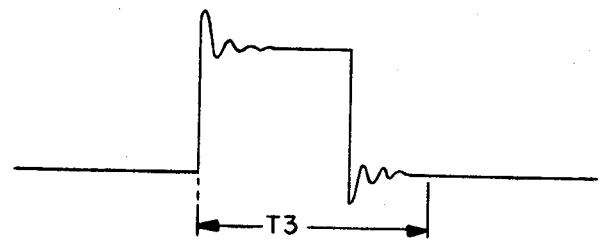
FIG. 6 is a waveform of an oscillation voltage from the voltage controlled oscillator as shown in FIG. 3 and is useful in explaining the locking of the phase locked loop shown in FIG. 3.

The muting circuit 20 responds to the muting pulse a to attenuate an output therefrom for a time period equal to the duration T1 as shown in FIG. 5. Therefore, a voice output from the loudspeaker 24 is temporarily muted for that time period as will readily be understood from the illustration of FIG. 5.

Figure 7:
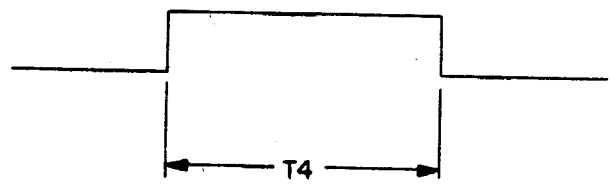
FIG. 7 is a waveform of a loop band changing pulse applied to the loop filter shown in FIG. 3.

Simultaneously with the application of the muting pulse a to the muting circuit 20 the control unit 38 also applies to the frequency dividing means 48 data of a frequency division ratio b and to the loop filter 34 a loop band changing pulse c having a pulse width or duration T4 as shown in FIG. 7. When the frequency division ratio is alloted to a different broadcast station to be changed from the present station, the control unit 38 acts as first control means and when the frequency division ratio is alloted to the present station the control unit 38 acts as second control means. In each case the arrangement of FIG. 3 is tuned to the alloted station in the manner as will be described later.

The loop filter 34 responds to the loop band changing pulse c to close the analog switch 42 (see FIG. 2) so as to shortcircuit the resistor R1 (see FIG. 2) resulting in a decrease in the loop time constant of the PLL as described above in conjunction with FIG. 2.

The frequency dividing means 48 including down counter 46 and programmable divider 30 responds to the data of control unit output b. The frequency division ratios of the down counter 46 and the programmable divider 30, are respectively 1/$n_l$ and 1/$N_p$ where $n_l$ and $N_p$ are integers. The frequency division ratios of the two modulus prescaler 28' are determined by down counter 46.

Thus, the two modulus prescaler 28' frequency divides an output from the voltage controlled oscillator 26 at the frequency division ratio 1/(P+1) and repeats this frequency division $n_l$ times. During the repeated frequency division, the down counter 46 and the programmable divider 30 decrease in count by decrements of one (1). When the two modulus prescaler 28' effects the frequency division $n_l$ times, the down counter 46 reaches a zero count. At that time, the frequency division ratio of the two modulus prescaler 28' changes to 1/P and the programmable divider 30 has a count of ($N_p - n_l$). When the programmable divider 30 counts down to zero, the initial state is returned back.

Thus, the frequency dividing means 48 has an integral frequency divisor N expressed by:

$$N = n_l + MN_p \tag{5}$$

where M designates a modulus which may be ten (10) for a decimal data representation of the frequency division ratio 48. The expression (5) may be transformed into the following expression (6):

$$N = (N_l - n_l)M + n_l(M+1) \tag{6}$$

Assuming that N is a function of $n_l$ expressed by $N(n_l)$ and an output frequency from the voltage controlled oscillator 26 is also a function of $n_l$ expressed by $F(n_l)$, $$F(n_l+1) - F(n_l) = Fs\{N(n_l+1) - N(n_l)\} \tag{7}$$

results. Since:

$$N(n_l+1) - N(n_l) = 1,$$

the expression (7) may be reduced to:

$$F(n_l+1) - F(n_l) = Fs = F_{REF} \tag{8}$$

The expression (8) implies that, if $N_l$ increases with increments of one (1), then the step frequency $F_{REF}$ becomes higher by the reference frequency Fs.

When the arrangement of FIG. 3 is used with the FM band in Europe, $$F_{REF} = 50 \text{ kHz}$$

results because the frequency allotment in Europe is such that broadcasting stations have respective frequencies changed with increments of 50 kilohertzs in the FM band. The above expressions describe the fact that the step frequency $F_{REF}$ can be raised and also that the natural angular frequency ωn expressed by the expression (1) can be low as compared with the case when the frequency division ratio is maintained at a fixed value.

On the other hand, the loop filter 34 has a decreased time constant as described above. This decrease in time constant permits a time interval T3 (see FIG. 6) of the PLL between the suspension of the reception of the new received present station followed by the locking of the PLL to another frequency and the re-locking thereof to an interval which is shorter than the duration T1 of the muting pulse a, resulting in the PLL shortening its pulling-in time. However, the voltage controlled oscillator 26 has an increased jitter which, in turn deteriorates the received signal-to-noise ratio because the oscillator acts as a local oscillator for the frequency mixer 14.

As described above, the muting circuit 20 attenuates its output or the voice output from the loudspeaker 24 for the duration T1 of the muting pulse a equal to the duration T4 of the loop band changing pulse c. As a result, the user cannot sense a change in the reception status from one broadcasting station to a different broadcasting station.

Except for the duration T4, the loop filter 34 has a large time constant so as to render the natural angular frequency ωn small. Therefore a minimum jitter value is developed in the voltage controlled oscillator 26 so as to permit the present station to be received at a good signal-to-noise ratio.

From the foregoing it is seen that, the present invention comprises a frequency dividing means formed of a two modulus prescaler having a frequency division ratio which is changeable from 1/P to 1/(P+1), a programmable divider connected to the prescaler and a down counter forming a feedback path of the two modulus prescaler. The frequency dividing means is effective for significantly shortening the time interval between the suspension of the reception of the present station during the reception thereof followed by the locking of a PLL to another frequency and the re-locking of the PLL to the frequency of the present station.

Figure 8:
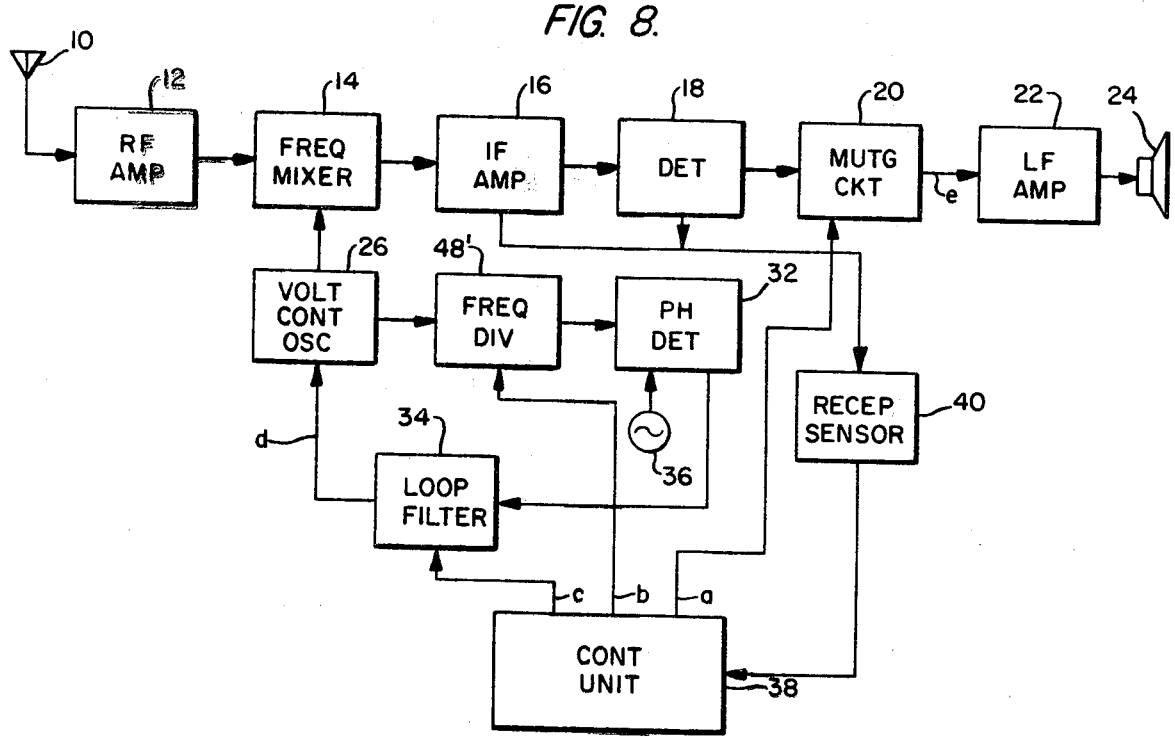
FIG. 8 is a block diagram of a modification of the present invention.

Referring now to FIG. 8 wherein like reference numerals designate the components identical or corresponding to those shown in FIG. 1 or 3, there is illustrated a modification of the present invention. The illustrated arrangement is different from that shown in FIG. 3 only in that in FIG. 8, a frequency divider 48' is substituted for the two modulus prescaler 28', the programmable counter 30' and the down counter 46 connected to one another as shown in FIG. 3 and divides the frequency of the output from the voltage controlled oscillator 26 by a frequency divisor given by the control unit 38.

In the illustrated example, the expressions (2) and (3) are reduced to:

$$\omega n = \sqrt{\frac{KoKd}{\tau_1}} \quad (2')$$

and $$\xi = \frac{\tau_2}{2}\sqrt{\frac{KoKd}{\tau_1}} \quad (3')$$

respectively. Like the expressions (2) and (3), the expressions (2') and (3') indicate that an increase in natural angular frequency ωn causes the PLL to shorten its pulling-in time and that, on the contrary, a decrease in natural angular frequency ωn causes the PLL to lengthen its pulling-in time. Furthermore, it is seen that, when the PLL shortens or lengthens its pulling-in time, the voltage controlled oscillator 26 respectively increases or decreases its jitter. Since the voltage controlled oscillator 26 acts as a local oscillator for the frequency mixer 14, an increase in the jitter thereof results in the deterioration of the signal-to-noise ratio of the arrangement of FIG. 8. In the illustrated example, therefore, the natural angular frequency ωn is increased so as to shorten the pulling-in time of the PLL only during the duration T4 of the loop band changing pulse c whereby T3<T1 is sufficiently fulfilled.

In other respects the arrangement of FIG. 8 is substantially identical in operation to that shown in FIG. 3.

From the foregoing it is seen that the present invention includes means for decreasing a time constant of a loop filter upon changing from one to another of two broadcasting frequencies to be received, whereby the particular phase locked loop can be locked to the changed frequency within an extremely short time interval.

While the present invention has been illustrated and described in conjunction with a few preferred embodiments thereof, it is to be understood that numerous changes and modification may be resorted to without departing from the spirit and scope of the present invention. For example, if, during the reception of the present station an attempt is made only to sense the reception status of a radio wave from a different broadcasting station, then the muting circuit may be omitted. The analog switch may be replaced by a switch or a circuit having the function of attenuating the magnitude of the resistance included in the PLL in response to the loop band changing pulse.

What is claimed is:

1. A radio receiver for selectively receiving a common broadcast program from at least first and second broadcasting stations which are transmitting said common broadcast program at different frequencies, said receiver comprising: a tuner and a local oscillator circuit having a phase locked loop including a voltage controlled oscillator coupled to said tuner, a prescaler having a frequency division ratio which is changeable from one first value to another second value, said prescaler frequency-dividing an oscillator output signal from said voltage controlled oscillator, a first frequency dividing means having a settable frequency division ratio, said first frequency dividing means frequency-dividing an output signal from said prescaler which has been frequency divided at said first value of said prescaler frequency division ratio so as to change said frequency division ratio of said prescaler by a frequency divided output from said first frequency dividing means, a second frequency dividing means having a settable frequency division ratio, said second frequency dividing means frequency-dividing an output from said prescaler which has been frequency divided at said first and second values of said prescaler frequency division ratio, a phase detector for receiving a reference signal and an output signal from said second frequency dividing means, and a loop filter for feeding an output signal from said phase detector to said voltage controlled oscillator for use as a control voltage for said voltage controlled oscillator, a control means coupled to said local oscillator circuit for tuning said tuner to the frequency of said second broadcasting station for a relatively short time interval during the reception of signal from said first broadcasting station, a level comparison means for comparing a first reception level of said signal when tuner is tuned to the frequency of said first broadcasting station with a second reception level of a signal when said tuner is tuned to the frequency of said second broadcasting station, wherein said control means is responsive to an output of said level comparison means to change the tuning of said tuner so as to be tuned to the frequency of the one of said first and second broadcasting stations having the higher corresponding reception level.

2. A radio receiver as claimed in claim 1, wherein said loop filter includes a loop time constant changing means for decreasing a loop time constant of said phase locked loop during said relatively short time interval.

3. A radio receiver as claimed in claims 1 or 2, further comprising a muting means for attenuating an audio output of said receiver during said relatively short time interval.

* * * * *